United States Patent
Ko et al.

(10) Patent No.: US 6,770,567 B2
(45) Date of Patent: Aug. 3, 2004

(54) METHOD OF REDUCING PARTICULATES IN A PLASMA ETCH CHAMBER DURING A METAL ETCH PROCESS

(76) Inventors: Yong Deuk Ko, Unam Jukong APT 310-100 Busan-dong, Osan, Kyonggi (KR); Se Jin Oh, Room#203, 894-1, ingye-dong, Paldal-gu, Suwon, Kyonggi (KR); Chan Ouk Jung, Woosung APT 105-1203 Yangjae-dong 154-2 Seocho-Gu, Seoul (KR); Jeng H. Hwang, 20835 Scofield Dr., Cupertino, CA (US) 95014

( * ) Notice: Subject to any disclaimer, the term of this patent is extended or adjusted under 35 U.S.C. 154(b) by 283 days.

(21) Appl. No.: 09/918,671

(22) Filed: Jul. 27, 2001

(65) Prior Publication Data

US 2003/0008517 A1 Jan. 9, 2003

(30) Foreign Application Priority Data

Jul. 6, 2001 (KR) ................................ 10-2001-0040309

(51) Int. Cl.[7] ............................................ H01L 21/302
(52) U.S. Cl. ..................... 438/711; 438/714; 438/720; 438/722; 438/905; 438/710
(58) Field of Search ................................ 438/689, 706, 438/710, 711, 714, 720, 722, 905; 134/1.1

(56) References Cited

U.S. PATENT DOCUMENTS

| | | | |
|---|---|---|---|
| 5,756,400 A | * 5/1998 | Ye et al. | 438/710 |
| 5,811,356 A | 9/1998 | Murugesh et al. | 438/711 |
| 5,824,375 A | 10/1998 | Gupta | 427/569 |
| 6,020,035 A | 2/2000 | Gupta et al. | 427/534 |
| 6,103,055 A | 8/2000 | Maher et al. | 156/345 |
| 6,121,161 A | 9/2000 | Rossman et al. | 438/783 |
| 6,143,078 A | 11/2000 | Ishikawa et al. | 118/715 |
| 6,143,389 A | * 11/2000 | Dietrich et al. | 428/69 |
| 6,143,476 A | * 11/2000 | Ye et al. | 430/318 |
| 6,261,967 B1 | * 7/2001 | Athavale et al. | 438/717 |
| 6,265,318 B1 | * 7/2001 | Hwang et al. | 438/720 |
| 6,368,517 B1 | * 4/2002 | Hwang et al. | 216/67 |
| 2001/0050267 A1 | * 12/2001 | Hwang et al. | 216/67 |

FOREIGN PATENT DOCUMENTS

EP 0892083 1/1999 ........... C23C/16/44

OTHER PUBLICATIONS

J. Hughes et al., "Dry Etch Sequencing Induced Gate Oxide Degradation due to Metallic Contamination in 0.25 $\mu$m CMOS Manufacturing", *International Electronic Devices Meeting*, pp. 337–340 (1998).

K. K. Singh et al., "Residual $CF_x$ Radicals From Periodic Dry Cleans of $Ar^+$ Sputter Etch Chember: Causes and Process Consequences", *Electrochemical Society Proceedings*, vol. 31, pp. 182–189 (1997).

S. Tehrani et al., "Progress and Outlook for MRAM Technology", *IEEE Transactions on Magnetics*, vol. 35, No. 5, pp. 2814–2819. (Sep. 1999).

* cited by examiner

*Primary Examiner*—Nadine G. Norton
*Assistant Examiner*—Binh X. Tran
(74) *Attorney, Agent, or Firm*—Shirley L. Church; Joseph Bach; Kathi Bean

(57) ABSTRACT

Contaminants are generated during etching processes for forming electrodes of storage capacitors for very high density future memory cells, such as ferroelectric random access memory (FeRAM) cells. These contaminants include significant quantities of noble metals, and in particular iridium and iridium compound particulates. In order to prevent undesirable iridium and iridium compound particulates from adversely affecting subsequent etching processes performed in the chamber, the plasma metal etch chamber is seasoned by exposing interior surfaces of the chamber to a seasoning plasma generated from a gas mixture comprising at least two gases selected from the group consisting of $BCl_3$, HBr, and $CF_4$. The chamber seasoning method of the invention is also applicable to etch processes involving other noble metals, such as platinum.

29 Claims, 6 Drawing Sheets

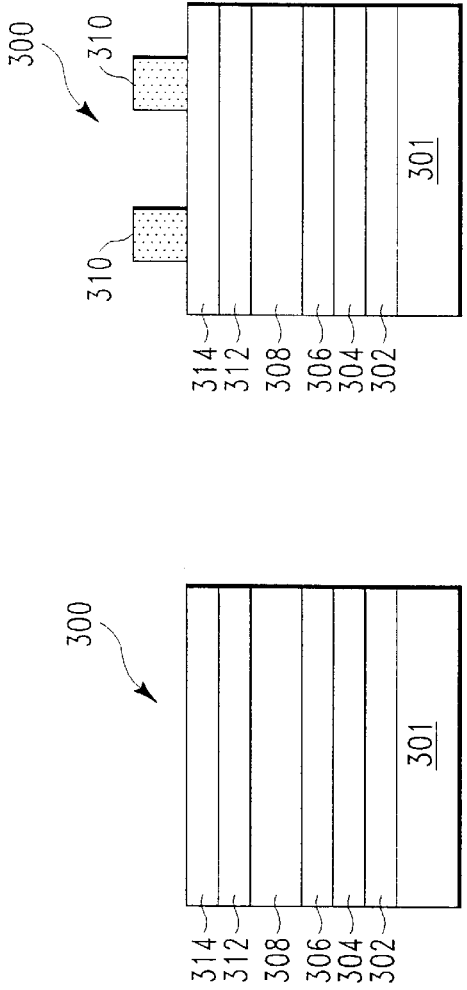
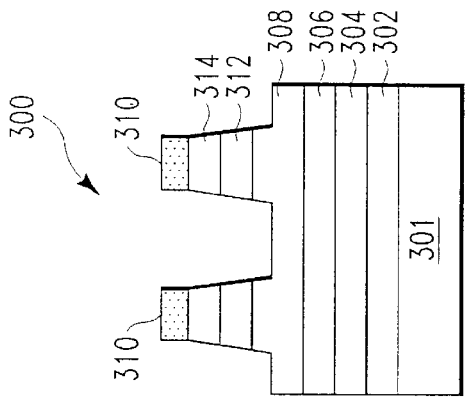
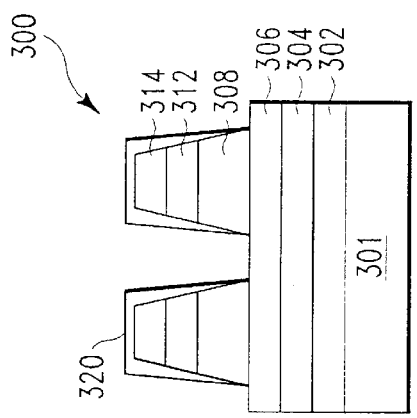
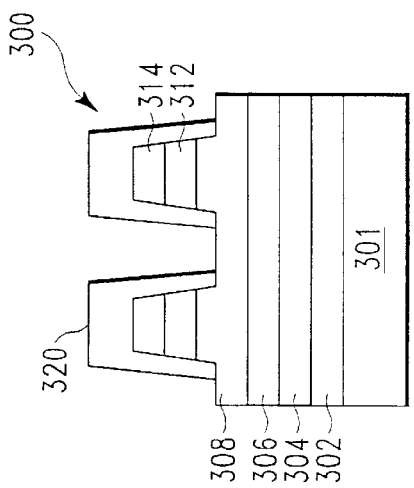
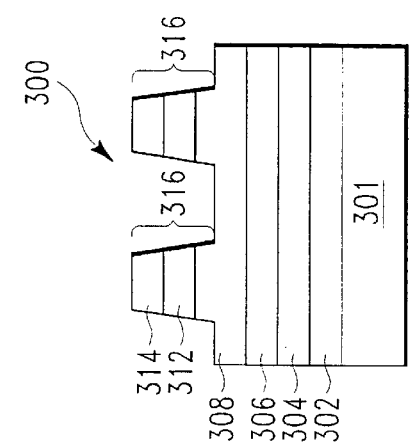

METHOD OF REDUCING PARTICULATES IN A PLASMA ETCH CHAMBER DURING A METAL ETCH PROCESS

BACKGROUND OF THE INVENTION

1. Field of the Invention

The present invention pertains to a method of reducing contaminants in a semiconductor processing environment. In particular, the present invention pertains to a method of preventing particulates of iridium (Ir) and other noble metals, such as platinum (Pt), from adversely affecting an iridium/iridium compound etch process performed in a plasma etch chamber.

2. Brief Description of the Background Art

Ferroelectric random access memory (FeRAM) cells have been introduced as a future generation of very high density memory cells, potentially at the giga bit level and beyond. Storage capacitors in such FeRAM cells require new materials for their electrodes and dielectrics in order to meet increasingly small design requirements. Lead zirconium titanate (PZT) is a leading candidate for a dielectric material for FeRAM cells. PZT, referred to as a high dielectric constant (k>20) material, has been found to have excellent characteristics for use in very high density storage capacitors. When storage capacitors are formed with a PZT layer sandwiched between electrodes made of metals such as aluminum and aluminum alloys, a longer data retention time is achieved than with conventional storage capacitors. However, the retention time gradually decreases, requiring frequent data refresh operations to be performed in order to safely retain data within the storage capacitors. Therefore, conventionally used electrode metals have proven to be unacceptable for use with PZT in the fabrication of storage capacitors for use in future generation high density memory cells.

There are two basic requirements for storage capacitors for use in very high density memory cells: 1) longer retention time; and 2) tolerance to a large number of data refresh operations without significant deterioration of the charge characteristics during the lifetime of the memory cells. For example, for non-volatile memory (NVM) applications, the desired data retention time is over 10 years; for DRAM applications, data refresh operations may be performed more than one million times over the lifetime of the storage capacitors.

Recently, iridium and iridium compounds have been evaluated as new materials for electrodes of storage capacitors. Iridium and iridium compounds are known to have several advantages over conventional metals such as aluminum, including: 1) use of conventional chemical vapor deposition (CVD) methods to form the electrodes; 2) ability to be plasma etched; 3) good adhesion characteristics to PZT (i.e., chemically and physically stable interfaces); 4) good bonding characteristics with other metals for interconnections (i.e., good electrical contacts); and 5) stable and reliable operations at high temperatures when working with other elements and devices.

Storage capacitors formed with iridium and iridium compounds as electrodes and PZT as a dielectric material show excellent characteristics in terms of data retention time and allowable refresh operations. As a result, storage capacitors formed with PZT, iridium, and iridium compounds are a viable candidate for the future generation of storage capacitors.

One of the problems encountered with forming such a storage capacitor is that a significant number of contaminant particulates are generated during the etching process and remain inside the plasma etch chamber. Iridium particulates make up a large portion of the particulates observed in a plasma etch chamber subsequent to the formation of storage capacitors of the kind described above. FIG. 5 shows the composition of particulates, measured by energy dispersion spectroscopy (EDS), on a wafer that has been processed in a plasma etch chamber. Iridium particulates, in particular, remain even after a purge operation, and can seriously affect subsequent wafer processing operations.

The mean time between chamber cleaning operations is measured by Mean Wafers Between Cleans, MWBC. An economically feasible MWBC is about 400 to 500 wafers between cleaning operations, with the industry goal for mass production as high as 1000 wafers between cleaning operations, assuming a single wafer load per etch process per chamber. The use of iridium and iridium compounds in the formation of electrodes results in a significant reduction in the MWBC, sometimes to as low as 10 wafers, which makes forming electrodes using iridium and iridium compounds economically impractical.

U.S. Pat. No. 6,020,035, to Gupta et al., discloses a method of depositing a seasoning layer on surfaces of a substrate processing chamber, to cover contaminants (primarily fluorine-containing) which may be absorbed within the walls of insulation areas of the chamber and to block the release of these contaminants from chamber walls. Unfortunately, this conventional seasoning method was found to be ineffective at reducing the amount of free iridium and iridium compound particulates found floating within a plasma processing chamber after seasoning, even after cleaning with a purge gas.

Therefore, there is a need for a method of controlling undesirable residual iridium and iridium compound particulates and platinum particulates remaining within a plasma processing chamber, even after cleaning using methods currently known in the art.

SUMMARY OF THE INVENTION

The present invention provides a method of preventing particulates of iridium, iridium compounds, platinum, and other noble metals, which are generated during a metal etch process, from adversely affecting a subsequent metal etch process performed within the same plasma etch chamber. The method comprises exposing interior surfaces of the plasma etch chamber to a seasoning plasma generated from a gas mixture comprising at least two gases selected from the group consisting of $BCl_3$, HBr, and $CF_4$, for a time period sufficient that a subsequent measurement of particulate count on a monitor silicon wafer indicates an acceptable particulate count.

Reduction in iridium particulates in the plasma etch chamber after performing the seasoning method of the invention is significant, allowing as many as 400 to 500 wafers to be processed between cleaning operations. Such a significant increase in MWBC results in reduced processing costs, as well as improved yields.

Also disclosed herein is a method of forming a storage capacitor in a plasma etch chamber, comprising the following steps: a) exposing interior surfaces of the plasma etch chamber to a seasoning plasma generated from a gas mixture comprising at least two gases selected from the group consisting of $BCl_3$, HBr, and $CF_4$; b) purging the plasma etch chamber of remaining seasoning gas mixture; c) loading a substrate having at least one layer of a noble metal such as iridium or platinum formed thereon into the plasma etch chamber; and d) plasma etching the at least one layer of the noble metal.

Also disclosed herein is a method of forming a storage capacitor in a plasma etch chamber, comprising the following steps: a) loading a substrate having at least one layer of a noble metal such as iridium or platinum formed thereon into the plasma etch chamber; b) plasma etching the at least one layer of a noble metal; c) removing the substrate from the plasma etch chamber; d) cleaning the plasma etch chamber using a purge gas; and e) exposing interior surfaces of the plasma etch chamber to a seasoning plasma generated from a gas mixture comprising at least two gases selected from the group consisting of $BCl_3$, HBr, and $CF_4$.

Also disclosed herein is a method of preventing platinum particulates generated during etching of a layer of platinum in a plasma etch chamber from adversely affecting an etch process subsequently performed in the plasma etch chamber. This method comprises exposing interior surfaces of the plasma etch chamber to a seasoning plasma generated from a gas mixture comprising at least two gases selected from the group consisting of $BCl_3$, HBr, and $CF_4$.

BRIEF DESCRIPTION OF THE DRAWINGS

FIGS. 3A–3J illustrate a step-by-step process for forming a storage capacitor 340.

DETAILED DESCRIPTION OF THE PREFERRED EMBODIMENTS

Disclosed herein is a method of reducing particulates in a plasma etch chamber during a metal etch process. Exemplary processing conditions for performing the method of the invention are set forth below.

As a preface to the detailed description, it should be noted that, as used in this specification and the appended claims, the singular forms "a", "an", and "the" include plural referents, unless the context clearly dictates otherwise.

I. An Apparatus for Practicing the Invention

The embodiment example etch processes described herein were carried out in a CENTURA® Integrated Processing System available from Applied Materials, Inc., of Santa Clara, Calif.

Figure 1:
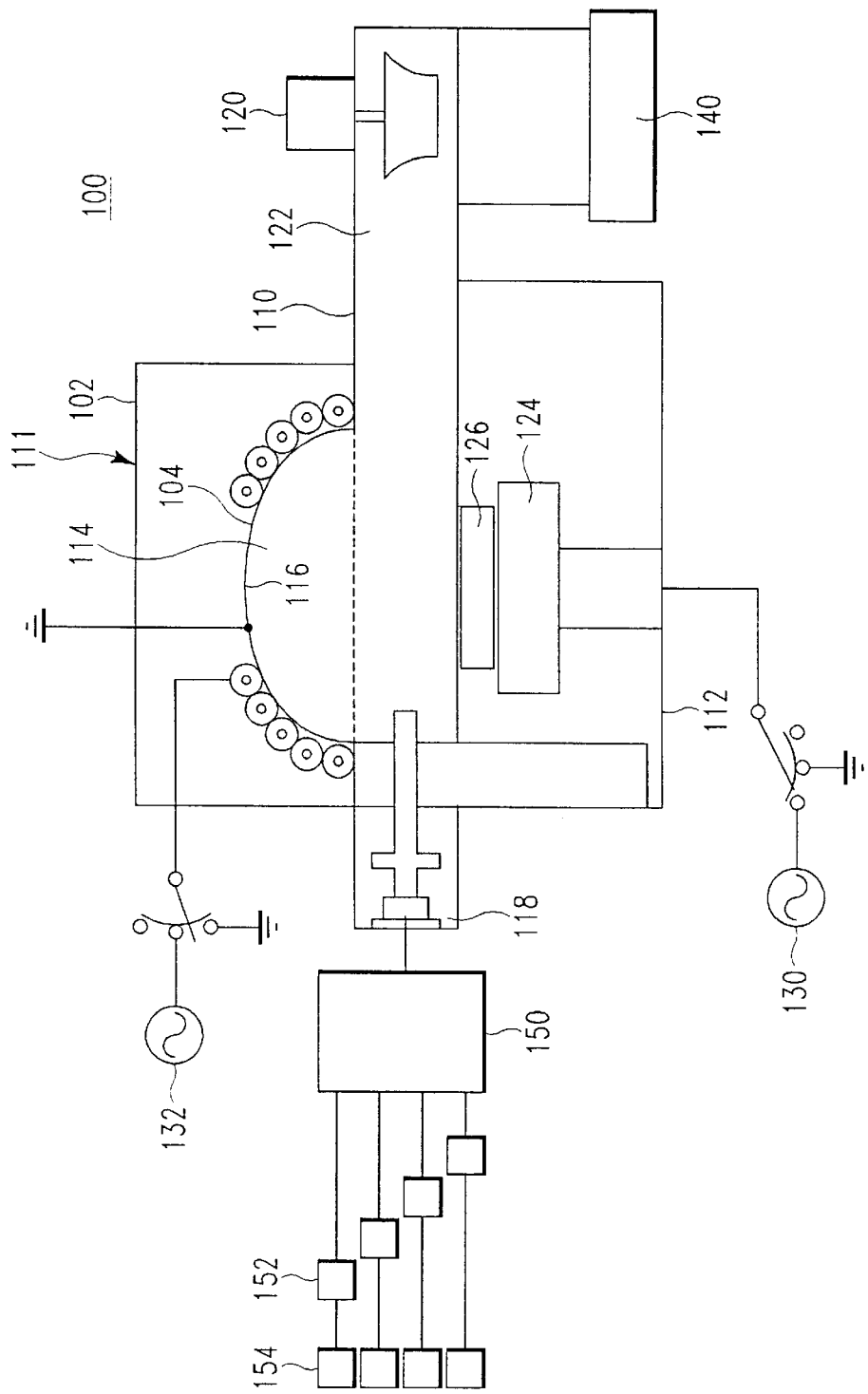
FIG. 1 shows a representative decoupled plasma source (DPS) etch chamber 100, in which plasma etching and seasoning in accordance with the present invention may be performed.

FIG. 1 is a schematic of an individual CENTURA® DPS™ etch chamber 100 of the type used in the Applied Materials' CENTURA® Integrated Processing System. The equipment shown in schematic in FIG. 1 includes a Decoupled Plasma Source (DPS) of the kind described by Yan Ye et al. at the Proceedings of the Eleventh International Symposium of Plasma Processing, May 7, 1996, and as published in the Electrochemical Society Proceedings, Volume 96-12, pp. 222–233 (1996). The CENTURA® DPS™ etch chamber 100 is configured to be mounted on a standard CENTURA® mainframe.

The CENTURA® DPS™ etch chamber 100 consists of an upper chamber 110 and a lower chamber 112. Wafer processing is performed in the upper chamber 110, which is isolated from the lower chamber 112 during processing. The upper chamber 110 is smaller than conventional plasma etch chambers, resulting in smaller and fewer areas in which processing gases could be trapped. This also reduces the pumpdown time.

The upper chamber 110 includes four gas injection nozzles 118 (only one is shown), an endpoint window (not shown), and a manometer port (not shown). The gas injection nozzles 118 are located at each corner of the upper chamber 110. Processing gases are routed from a gas panel (not shown) to the bottom of the chamber 110, and through a V-block valve (not shown). After the V-block valve, a gas line (not shown) branches to each side of the upper chamber 110, and then branches again to each gas injection nozzle 118. Each of the four lines (not shown) is routed through the lower chamber 112 wall, up to the gas injection nozzles 118 of the upper chamber 110. During wafer processing, processing gases are injected through the gas injection nozzles 118 and into the DPS etch chamber 100.

The upper chamber further includes a pumping channel 122 and a throttle valve assembly 120, located at the end of the pumping channel 122. The throttle valve 120 controls chamber pressure by restricting the pumping orifice while gas is flowing into the upper chamber 110. Preferably, the throttle valve 120 is of the plunger type, and is driven by a stepper motor (not shown).

A dome assembly 104 seals the upper chamber 110 during wafer processing. An RF coil, wrapped around the top of the dome 104, is excited by RF energy originating from a source RF generator (which is discussed further below). The dome 104 may be constructed of ceramic. A housing 102 fits over the dome 104 to prevent RF leakage and to shield the operator from UV light emissions. The dome 104 is heated or cooled, depending on the particular chamber activity.

The dome 104 needs to be maintained at a constant temperature, regardless of processing conditions, in order to prevent flaking off of deposited etch byproducts. Lamps (not shown) located in the midsection of the dome housing 102 are used to maintain the dome temperature when the chamber is not in use. When the chamber is not in use, lamp power is increased to keep the dome temperature from dropping below the chamber wall temperature. During processing, the lamp power output is reduced as the plasma heats up the dome 104.

In the lower chamber 112, a cathode 124 is positioned to move a wafer 126 into the upper chamber 110 for processing, while the lower chamber 112 remains sealed from the processing environment. The primary function of the lower chamber 112 is to transfer the wafer 126 between the robot blade (not shown) and the cathode 124 in a relatively clean environment. Since the double chamber design allows the upper chamber 110 to be removed and exchanged with another clean and prepared chamber, the chamber cleaning time is greatly reduced. Removal of the upper chamber 110 allows access to the lower chamber for maintenance. Both chambers must be at atmospheric pressure prior to the performance of maintenance operations. The etch chamber 100 is attached to a buffer chamber in a mainframe (not shown).

For independent control of the ion flux and ion acceleration energy, two RF power generators are provided: a bias RF generator 130 and a source RF generator 132. The bias RF generator 130 is coupled to the cathode 124 for biasing the cathode. The source RF generator 132 is coupled to the RF coil wrapped around the exterior surface of the dome 104, and is used to enhance the plasma, in order to achieve a high etch rate. The source RF generator 132 excites the processing gases and creates more reactive ions, so that a high density plasma is generated. The high density plasma produces more collisions between the face electrons and the gas molecules, resulting in a more ionized and reactive plasma.

The above-described etch chamber design permits independent control of the plasma ion flux and ion acceleration energy. The etch chamber 100 decouples the ion flux to the wafer 126 and the ion acceleration energy. This is accomplished by producing plasma via the inductive source 132. While the source RF generator 132 determines the ion flux, the bias RF generator 130 determines the ion acceleration energy. This chamber design provides fully independent ion density control, creating an enlarged processing window. Processing window refers to the amount by which process conditions can be varied without having a detrimental effect on the product produced. The larger the processing window, the greater change permitted in processing conditions without a detrimental effect on the product. Thus, a larger processing window is desirable, as this generally results in a higher yield of in-specification product.

The DPS etch chamber design allows high purity $N_2$ to flow through the upper and lower chambers (110, 112, respectively) as needed. Purging of the upper chamber with $N_2$ begins automatically when the process recipe is completed, in order to minimize particulate production. A continuous $N_2$ purge is used in the lower chamber 112 when the cathode 124 is in the down position. After upper chamber wafer processing is completed and the cathode 124 holding the wafer 126 starts to descend, the lower chamber $N_2$ purge flows from the lower chamber 112 through the upper chamber 110, to prevent processing gases from migrating to the lower chamber 112.

The system operation of the DPS etch chamber 100 is similar to that described in U.S. Pat. No. 6,121,161, to Rossman et al., in conjunction with a high density plasma (HDP) CVD system.

II. Formation of a Storage Capacitor with PZT, Ir, and $IrO_2$

Figure 2:
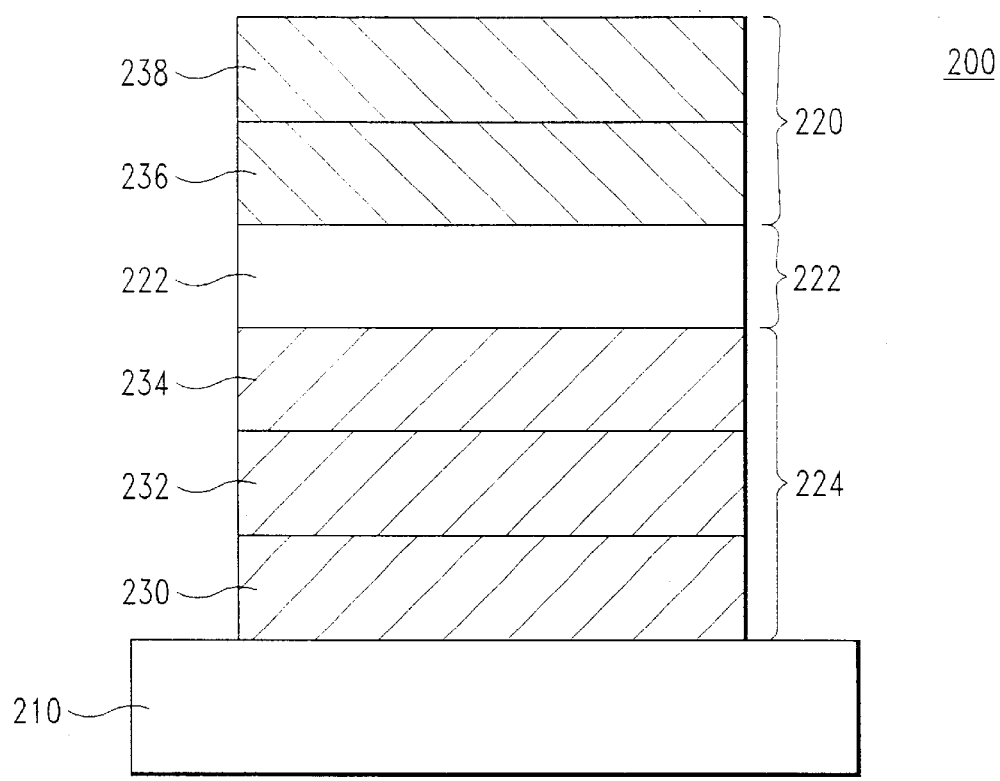
FIG. 2 is a simplified, cross-sectional view of a next-generation storage capacitor 200.

FIG. 2 shows a simplified, cross-sectional view of a next generation storage capacitor 200. As shown, layers of iridium 230, iridium oxide ($IrO_2$) 232, platinum (Pt) 234, PZT 222, iridium oxide 236, and iridium 238 are sequentially deposited on a substrate 210 to respectively form a lower electrode 224, PZT dielectric 222, and an upper electrode 220 of a storage capacitor 200. These layers of metals and dielectrics are formed by blanket deposition of metals and dielectrics over the entire surface of substrate 210 in the sequence described above. For the lower electrode, the layers of iridium 230, iridium oxide 232, and platinum 234 have thickness of about 1500 Å, 500 Å, and 1500 Å, respectively. The thickness of the PZT dielectric layer 222 is about 2000 Å. For the upper electrode 220, the layers of iridium oxide 236 and iridium 238 have thicknesses of about 300 Å and 1200 Å, respectively.

Figure 3I:
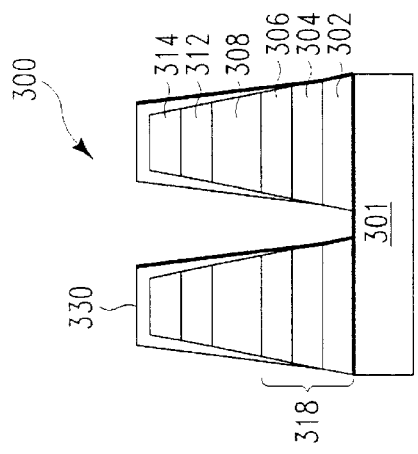

FIGS. 3A–3J illustrate a step-by-step process for forming a storage capacitor, as shown in FIG. 2. The process starts with the formation of a film stack 300, which consists of a set of metal and dielectric layers Ir 314/$IrO_2$ 312/PZT 308/Pt 306/$IrO_2$ 304/Ir 302, formed on substrate 301, as shown in FIG. 3A. Conventional metal and dielectric material deposition techniques known in the art, such as chemical vapor deposition (CVD) and physical vapor deposition (PVD) techniques, can be used to sequentially form the various layers.

A titanium nitride (TiN) hard mask 310, having a thickness of about 3000 Å, is then deposited over Ir layer 238 and patterned using conventional techniques known in the art, as shown in FIG. 3B. Ir and $IrO_2$ layers 314 and 312 are then pattern etched using techniques known in the art, to produce the structure shown in FIG. 3C. Residual TiN hard mask 310 remaining after etching of the Ir and $IrO_2$ layers 314 and 312 is then removed using techniques known in the art, thereby forming upper electrodes 316, as shown in FIG. 3D.

Figure 3H:
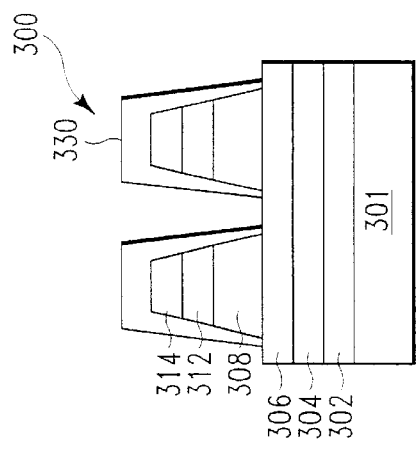

A photoresist layer is then formed over the top and side surfaces of upper electrodes 316 and is patterned to form a mask 320 using techniques known in the art (depending on the particular photoresist material used), to produce the structure shown in FIG. 3E. Then, the PZT dielectric 308 is pattern etched using techniques known in the art, as shown in FIG. 3F. Residual photoresist mask 320 remaining after etching of PZT dielectric layer 308 is then removed using techniques known in the art, as shown in FIG. 3G.

A TiN hard mask 330 is then formed over the top and side surfaces of upper electrodes 316 and PZT dielectric layer 308. The TiN hard mask 330 is patterned using techniques known in the art, as shown in FIG. 3H. Subsequently, a metal etch process is conducted in order to pattern etch the bottom three metal layers Pt 306/$IrO_2$ 304/Ir 302, down to the surface of substrate 301, to form lower electrodes 318, as shown in FIG. 3I. Residual titanium nitride hard mask 330 remaining after etching of metal layers 306, 304, and 302 is then removed by plasma etching, using etchant gases and process conditions known in the art, to form the structure shown in FIG. 3J.

Figure 3J:
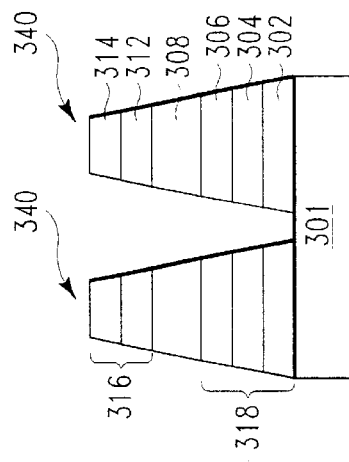
Figure 3G:
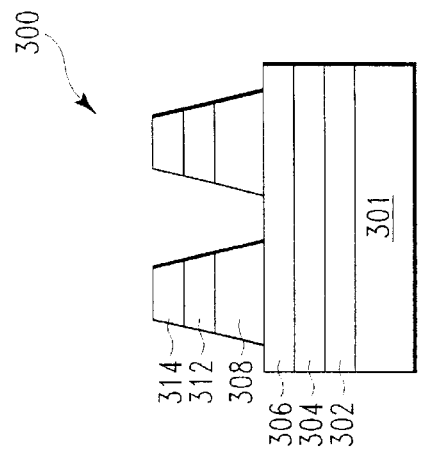

FIG. 3J shows the final storage capacitors 340 formed using the above-described process. The width of top Ir layer 314 is about 0.7 μm, whereas bottom Ir layer 302 typically has a width of about 1.2–1.3 μm. The slope of the etched surface angle from the top to the bottom of storage capacitor 340 is about 70°. The duration of the entire storage capacitor fabrication process is about 120 seconds.

III. Seasoning the Plasma Etch Chamber

The metal etch steps illustrated in FIGS. 3C, 3D, 3I, and 3J take place inside the upper chamber 110 of the DPS etch chamber 100 shown in FIG. 1. During these metal etch processes, significant quantities of Ir, $IrO_2$, and Pt particulates are generated. The majority of these particulates are removed by performing a nitrogen ($N_2$) purge cycle. However, a considerable amount of Ir and Ir compound particulates still remain in the upper etch chamber 110 after performance of the $N_2$ purge cycle. These particulates adversely affect subsequent wafer processing.

Figure 4:
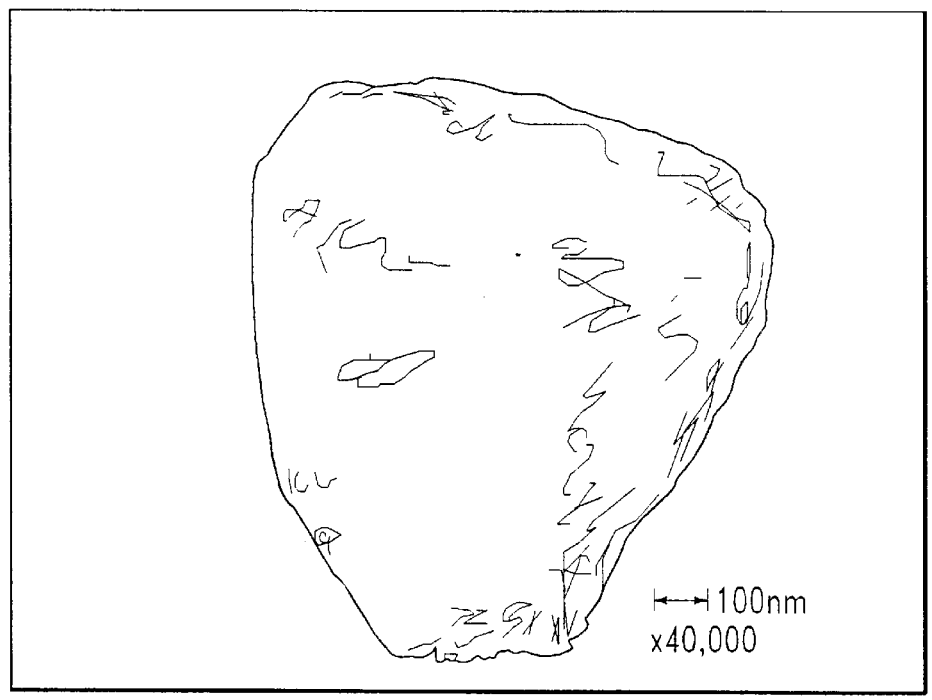
FIG. 4 is a scanning electron micrograph (SEM) 400 of a typical iridium particulate.
Figure 5:
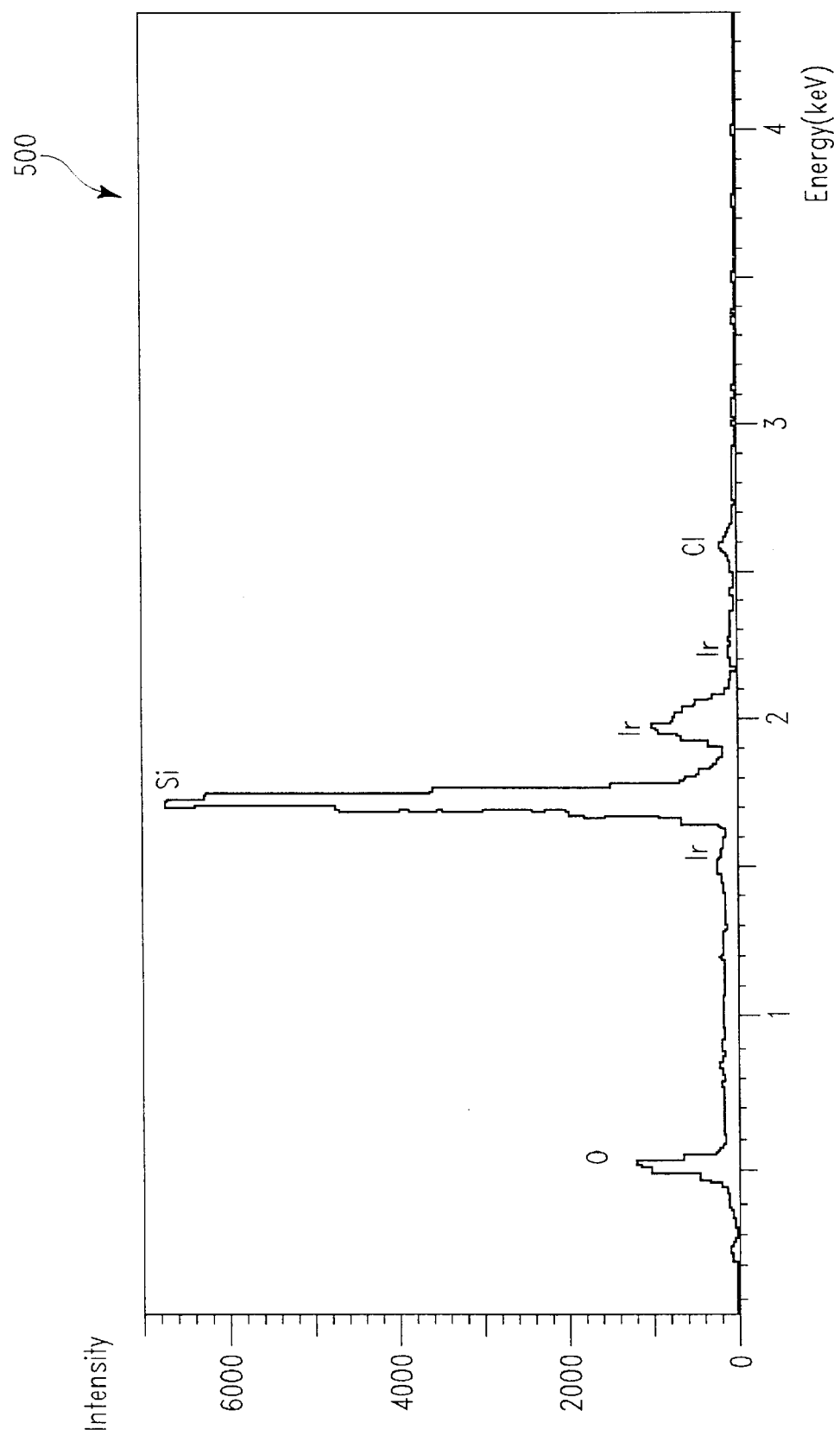
FIG. 5 is a graph 500 showing the composition of particulates, measured by energy dispersion spectroscopy (EDS), on a wafer that has been processed through a plasma etch chamber.

FIG. 4 is a scanning electron micrograph (SEM) 400 of a typical iridium particulate. Normally, any particulate size less than 75% of the minimum feature size is considered "harmless". FIG. 5 is a graph 500 showing the composition of particulates, measured by energy dispersion spectroscopy (EDS), on a wafer that has been processed in a plasma etch chamber in the manner described above.

To determine when a seasoning process is necessary, the condition of the process chamber must be measured. One method of measuring process chamber condition is by obtaining an indication of the number of particulates in the upper etch chamber 110. To do this, a monitor wafer with a known particulate count is loaded into the upper etch chamber 110, a monitor wafer process is carried out, and then the monitor wafer is removed and a second particulate count is made on the monitor wafer, using a particulate detection tool, such as a KLA Tencor® particulate detection tool. When the increase in particulate count exceeds about 20, the etch chamber is considered unusable for processing the next wafer.

The monitor wafer process may be designed for a given application. One example of a monitor wafer process would be following an etch process recipe (such as an iridium layer etch recipe), including the same process variables, with the exception that no power is applied to the apparatus to generate a plasma. This was the monitor wafer process used in the examples herein, where the monitor wafer was a bare silicon wafer, and the time period the monitor wafer was processed varied from about 60 seconds to 110 seconds. Another example monitor wafer process would be to follow the etch process recipe including the application of plasma source power and cathode bias power (or plasma source power alone), using a silicon oxide-coated silicon wafer. An additional example monitor wafer process would be to use an inert gas rather than a combination of the process gases used during the etch process itself; or to use a single gas selected from the three process gases named above. In any case, when one skilled in the art selects a monitor wafer process, it is then necessary to determine what increase in particle count on the monitor wafer is an indication (for that monitor wafer process) that a seasoning process needs to be carried out before any additional wafer substrates are etched.

Eventually, the high particulate-containing etch chamber must be opened for wet cleaning in order to lower the particulate count. If the chamber is opened frequently for cleaning, then the Mean Wafer Between Cleans (MWBC) drops dramatically. Without using the seasoning method of the present invention, the MWBC is as low as 10 wafers or less between cleaning operations, whereas 400 to 500 wafers between cleaning operations is considered economically acceptable.

In one embodiment of the chamber seasoning method of the invention, a dummy wafer having an Ir layer thereon is placed within upper chamber 110, and a seasoning gas mixture of $BCl_3$, HBr, $CF_4$, and Ar is injected into upper chamber 110 through the gas injection nozzles 118 during etch chamber preparation for the next wafer processing operation. The four gases are stored in separate reservoirs 154, fed into a gas mixing block 150, then injected into upper etch chamber 110 through gas injection nozzles 118. While the particular embodiment described above used four gases, seasoning of the chamber according to the present invention can be accomplished using two or more gases. For example, combinations such as $BCl_3$ and $CF_4$ can be used.

Process variables for performing the chamber seasoning method of the invention, such as gas flow rates, process chamber pressure, process chamber temperature, wafer carrier (cathode) temperature, and applied RF power levels can be selected to achieve optimal chamber seasoning. For example, the seasoning gases consisting of $BCl_3$, HBr, $CF_4$, and Ar are delivered to gas mixing block 150 by means of four mass flow rate meters 152, preferably at rates of 30 sccm, 30 sccm, 30 sccm, and 40 sccm, respectively. The seasoning gases may be injected into the etch chamber 110 at flow rates which are different from the preferred rates, resulting in varying particulate controlling efficiencies. One skilled in the art will be able to optimize seasoning gas flow rates for given operating environments with minimal experimentation.

The process chamber pressure is preferably maintained within a range of about 5 mTorr to about 10 mTorr. Particularly good results were obtained using a process chamber pressure of 8 mTorr. After injecting the seasoning gas mixture, the source power fro the source RF generator 132 and the bias power from the bias RF generator 130 are applied for about 30–120 seconds, preferably about 45 seconds, in order to generate a seasoning plasma within etch chamber 110.

Preferably, the plasma source power applied during seasoning is within the range of about 1000 W to about 1400 W. The bias power applied to the cathode is preferably within the range of about 150 W to about 250 W. Satisfactory results were obtained using a DPS chamber with a source power of 1400 W and a bias power of 200 W. During performance of the seasoning process, the cathode 124 was maintained at a temperature of 45° C., and the chamber wall and dome were maintained at a temperature of 80° C. The dummy wafer was cooled by flowing helium gas with a pressure of 4 Torr between the wafer and an electrostatic chuck that holds the wafer onto the cathode.

A preferred embodiment process for testing and seasoning a DPS metal etch chamber using a $BCl_3$/HBr/$CF_4$/Ar seasoning gas mixture includes the following steps:

1) Measure a particulate count on a monitor wafer inspected with an inspection tool. The monitor wafer is processed in the etch chamber for a time period ranging from about 60 seconds to about 110 seconds to perform the measurement.

2) If the measured particulate count is greater than 20 particulates per wafer, place a dummy wafer having an Ir layer in the metal etch chamber and season the metal etch chamber using a seasoning plasma generated from a $BCl_3$/HBr/$CF_4$/Ar gas mixture. After seasoning, purge the etch chamber of the remaining gas mixture.

Figure 6:
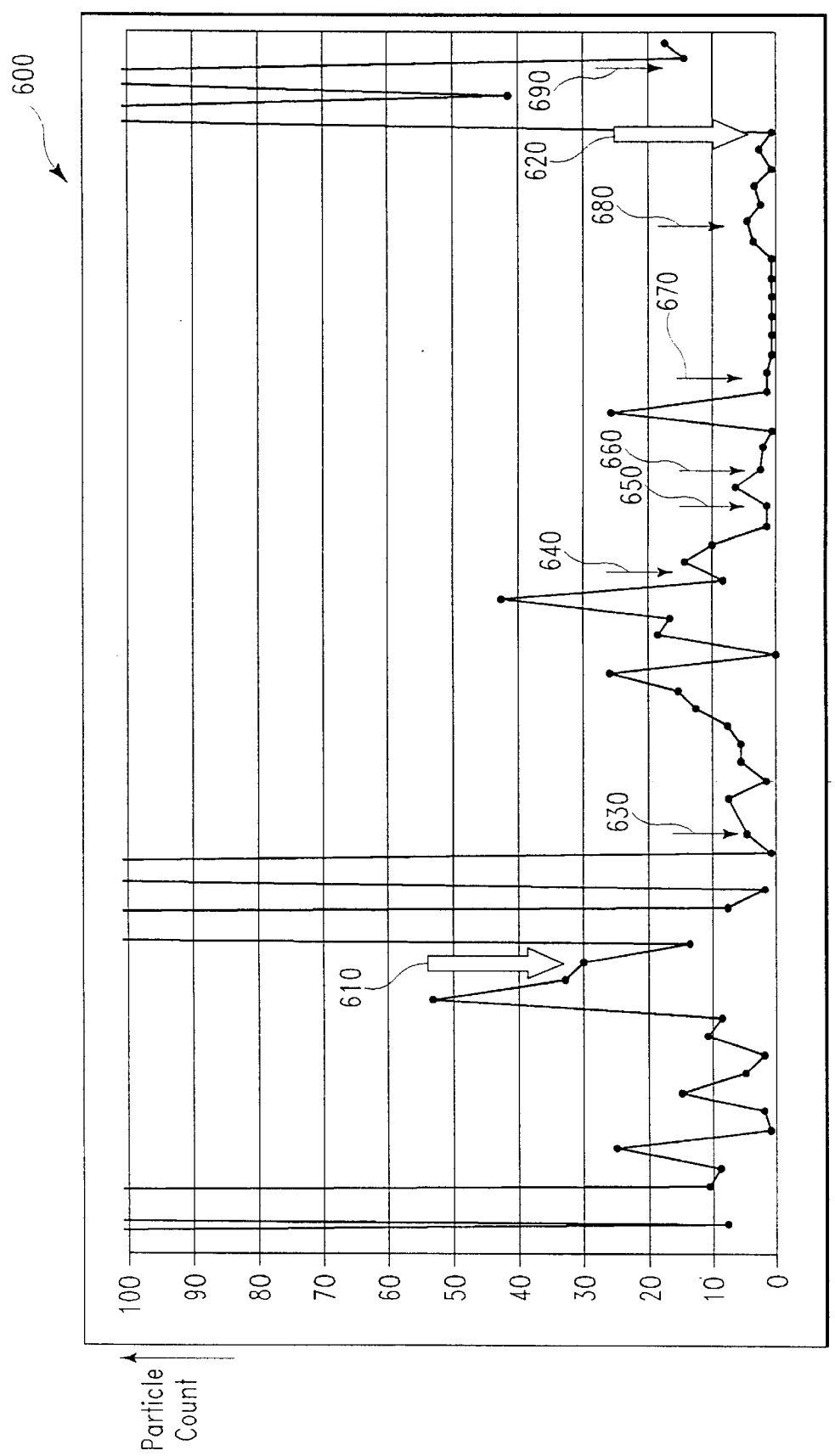
FIG. 6 is a graph 600 showing changes in iridium particulate counts over time, as cleaning and seasoning of the etch chamber are performed in accordance with the present invention.

FIG. 6 is a graph 600 showing changes in iridium particulate counts over time, as cleaning and seasoning of the etch chamber are performed in accordance with the present invention. The first etch chamber cleaning took place at sequence point 610 (indicated by the white arrow). Cleaning was performed according to a standard cleaning process, in which the inner surfaces of the upper chamber 110 and dome 104 were wiped off with a wet cloth in order to remove the Ir particulates adhered to the inner surface of the etch chamber 110. Despite the fact that the particulates on the inner surfaces of the upper chamber 110 and dome 104 were thoroughly wiped off, the Ir particulate count on a dummy wafer after subsequent etching was significant.

At sequence point 630, a first seasoning was performed using a gas mixture of $BCl_3$, HBr, $CF_4$, and argon. A wafer subsequently etched in the seasoned chamber had a particulate count below 10. However, as more wafers were processed, the particulate count reached 26, exceeding the upper limit of 20. Several more wafers were processed, until a particulate count of 43 was reached. At this time, another seasoning operation was performed. Following seasoning, the particulate count dropped below 20. Additional seasoning operations were performed at sequence points 650, 660, 670, and 680. The wafers etched after these seasoning operations each had only a few particulates.

In order to evaluate the effects of not seasoning the chamber, another standard wet cleaning operation of the inner surfaces of upper chamber 110 and dome 104 was performed at sequence point 620, even though the particulate count at the time was well below the upper limit of 20. The result was another substantial particulate count, as expected. Almost immediately after performance of the wet cleaning operation at sequence point 620, another seasoning operation was performed at sequence point 690. The particulate count dropped to 15, well below the upper limit of 20.

The experimental data described above with reference to FIG. 6 indicate that seasoning of the etch chamber using a mixture of $BCl_3$, HBr, $CF_4$, and argon gases reduces particulate counts significantly. When the seasoning operation is performed as needed, the particulate counts of etched wafers in the DPS chamber 100 can be assured to be sustainably well below the upper limit of 20.

Contaminants generated during the etching of wafers having iridium layers are predominantly iridium particulates. Because iridium, as a noble metal, does not react well with other chemicals, iridium particulates generated during an etch process are not readily removed by a subsequent purge operation or by chemical means. However, we have demonstrated that seasoning of a plasma etch chamber using a seasoning plasma generated from a mixture of gases consisting of $BCl_3$, HBr, $CF_4$, and argon is very effective at reducing the amount of iridium particulates remaining in the etch chamber after a metal etch process.

$BCl_3$ and HBr are vaporized from the liquid state. These gases produce massive amounts of polymer particulates and byproducts in the plasma state. Since the vaporized $BCl_3$ and HBr gases are "wet" or "damp" in the gaseous state, these polymers and byproducts have good adhesion to the ceramic dome and wall surfaces of the plasma etch chamber. Therefore, these gases force the iridium particulates to adhere to inner surfaces of the upper chamber 110 of the DPS etch chamber 100. It is believed that the polymers and byproducts interact with each other to absorb a significant quantity of iridium particulates, so that the iridium particulates can be readily purged from the upper chamber 110. It is also believed that the iridium particulates remaining in the upper chamber are forced to adhere to the inner surfaces of the upper chamber walls, as well as to the ceramic dome. As a result, the seasoning plasma effectively and significantly reduces the amount of undesirable and detrimental iridium particulates.

The present invention provides a method of dramatically reducing iridium and iridium compound particulates generated during the process of forming electrodes for a new generation of storage capacitors for FeRAM applications. However, one skilled in the art will readily appreciate that the present invention is not limited to controlling iridium and iridium compound particulates, but can also be applied to controlling particulates of other noble metals, such as platinum. As such, the above described preferred embodiments are not intended to limit the scope of the present invention, as one skilled in the art can, in view of the present disclosure expand such embodiments to correspond with the subject matter of the invention claimed below.

We claim:

1. A method of reducing free iridium particulates generated during etching of a layer of iridium or an iridium compound in a plasma etch chamber, wherein said method comprises exposing interior surfaces of said plasma etch chamber to a seasoning plasma at a time prior to etching of said iridium or iridium compound, wherein said seasoning plasma is generated from a gas mixture comprising at least two gases selected from the group consisting of $BCl_3$, HBr, and $CF_4$, where by iridium particulates generated during subsequent etching of a layer of said iridium or iridium compound are adhered to a portion of said plasma etch chamber away from said layer of iridium being etched, and free iridium particles are reduced.

2. The method of claim 1, wherein said method further includes the step of placing a dummy wafer having at least one iridium layer formed thereon in said plasma etch chamber prior to exposing surfaces of said chamber to said seasoning plasma.

3. The method of claim 1, wherein said plasma etch chamber is a decoupled plasma source etch chamber.

4. The method of claim 3, wherein a plasma source power within the range of about 1000 W to about 1400 W and a substrate bias power within the range of about 150 W to about 250 W are applied during generation of said seasoning plasma.

5. The method of claim 4, wherein said plasma source power and said substrate bias power are applied for a time period within the range of about 30 seconds to about 120 seconds.

6. The method of claim 1, wherein said gas mixture additionally includes argon.

7. The method of claim 6, wherein said $BCl_3$ is provided at a flow rate of 30 sccm, said HBr is provided at a flow rate of 30 sccm, said $CF_4$ is provided at a flow rate of 30 sccm, and said argon is provided at a flow rate of 40 sccm, to said plasma etch chamber.

8. The method of claim 7, wherein a process chamber pressure within said plasma etch chamber is maintained within the range of about 5 mTorr to about 10 mTorr.

9. The method of claim 1, wherein said method further includes the step of cleaning the plasma etch chamber with a purge gas prior to exposing surfaces of said chamber to said seasoning plasma.

10. The method of claim 1, wherein said method further includes the step of purging said plasma etch chamber of remaining seasoning gas mixture after exposure of said surfaces of said chamber to said seasoning plasma.

11. A method of forming a storage capacitor in a plasma etch chamber, comprising the steps of:
a) exposing interior surfaces of said plasma etch chamber to a seasoning plasma generated from a gas mixture comprising at least two gases selected from the group consisting of $BCl_3$, HBr, and $CF_4$;
b) purging said plasma etch chamber of remaining seasoning gas mixture;
c) loading a substrate having at least one iridium layer formed thereon into said plasma etch chamber; and
d) plasma etching said at least one iridium layer, whereby iridium particulates generated during said etching are adhered to a portion of said plasma etch chamber away from said iridium layer being etched and free iridium particles are reduced.

12. The method of claim 11, wherein said method further includes the step of placing a dummy wafer having at least one iridium layer formed thereon in said plasma etch chamber prior to exposing surfaces of said chamber to said seasoning plasma.

13. The method of claim 11, wherein said plasma etch chamber is a decoupled plasma source etch chamber.

14. The method of claim 13, wherein a plasma source power within the range of about 1000 W to about 1400 W and a substrate bias power within the range of about 150 W to about 250 W are applied during generation of said seasoning plasma.

15. The method of claim 14, wherein said plasma source power and said substrate bias power are applied for a time period within the range of about 30 seconds to about 120 seconds.

16. The method of claim 11, wherein said gas mixture additionally includes argon.

17. The method of claim 16, wherein said $BCl_3$ is provided at a flow rate of 30 sccm, said HBr is provided at a flow rate of 30 sccm, said $CF_4$ is provided at a flow rate of 30 sccm, and said argon is provided at a flow rate of 40 sccm, to said plasma etch chamber.

18. The method of claim 17, wherein a process chamber pressure within said plasma etch chamber is maintained within the range of about 5 mTorr to about 10 mTorr.

19. A method of forming a storage capacitor in a plasma etch chamber, comprising the steps of:
   a) exposing interior surfaces of said plasma etch chamber to a seasoning plasma generated from a gas mixture comprising at least two gases selected from the group consisting of $BCl_3$, HBr, and $CF_4$, where by polymers and plasma byproducts are adhered to inner surfaces of said plasma etch chamber away from a location at which a substrate is processed;
   b) purging said plasma etch chamber of remaining seasoning gas mixture;
   c) loading a substrate having at least one iridium layer formed thereon into said plasma etch chamber; and
   d) plasma etching said at least one iridium layer, whereby platinum particulates generated during said etching are adhered to a portion of said plasma etch chamber away from said substrate and free iridium particles are reduced.

20. The method of claim 19, wherein said method further includes the step of placing a dummy wafer having at least one iridium layer formed thereon in said plasma etch chamber prior to exposing surfaces of said chamber to said seasoning plasma.

21. The method of claim 20, wherein said plasma etch chamber is a decoupled plasma source etch chamber.

22. The method of claim 21, wherein a plasma source power within the range of about 1000 W to about 1400 W and a substrate bias power within the range of about 150 W to about 250 W are applied during generation of said seasoning plasma.

23. The method of claim 22, wherein said plasma source power and said substrate bias power are applied for a time period within the range of about 30 seconds to about 120 seconds.

24. The method of claim 19, wherein said gas mixture additionally includes argon.

25. The method of claim 24, wherein said $BCl_3$ is provided at a flow rate of 30 sccm, said HBr is provided at a flow rate of 30 sccm, said $CF_4$ is provided at a flow rate of 30 sccm, and said argon is provided at a flow rate of 40 sccm, to said plasma etch chamber.

26. The method of claim 25, wherein a process chamber pressure within said plasma etch chamber is maintained within the range of about 5 mTorr to about 10 mTorr.

27. A method of reducing free platinum particulates generated during etching of a layer of platinum in a plasma etch chamber, wherein said method comprises exposing interior surfaces of said plasma etch chamber to a seasoning plasma at a time prior to etching of said platinum, wherein said seasoning plasma is generated from a gas mixture comprising at least two gases selected from the group consisting of $BCl_3$, HBr, and $CF_4$, whereby free platinum particulates generated during subsequent etching of a layer of said platinum are reduced 27.

28. The method of claim 27, wherein said free platinum particulates are generated during etching of an electrode which includes platinum, iridium oxide ($IrO_2$), and iridium layers.

29. The method of claim 27, wherein said gas mixture additionally includes argon.

* * * * *